US008653525B2

(12) United States Patent
Yamada

(10) Patent No.: US 8,653,525 B2
(45) Date of Patent: Feb. 18, 2014

(54) THIN-FILM TRANSISTOR AND THIN-FILM TRANSISTOR MANUFACTURING METHOD

(75) Inventor: Tatsuya Yamada, Osaka (JP)

(73) Assignee: Panasonic Corporation, Osaka (JP)

( * ) Notice: Subject to any disclaimer, the term of this patent is extended or adjusted under 35 U.S.C. 154(b) by 22 days.

(21) Appl. No.: 13/556,542

(22) Filed: Jul. 24, 2012

(65) Prior Publication Data
US 2013/0134429 A1 May 30, 2013

Related U.S. Application Data

(63) Continuation of application No. PCT/JP2011/006640, filed on Nov. 29, 2011.

(51) Int. Cl.
H01L 29/04 (2006.01)
H01L 21/00 (2006.01)

(52) U.S. Cl.
USPC ............ 257/59; 257/72; 438/149; 438/653

(58) Field of Classification Search
USPC ............ 257/59, 66, 72, E21.584, E29.292; 438/149, 166, 653
See application file for complete search history.

(56) References Cited

U.S. PATENT DOCUMENTS

| 6,255,706 | B1 | 7/2001 | Watanabe et al. |
| 6,933,525 | B2 | 8/2005 | Harano et al. |
| 7,356,296 | B2 | 4/2008 | Ito |
| 7,479,451 | B2 | 1/2009 | Harano et al. |
| 7,615,867 | B2 | 11/2009 | Kim et al. |
| 7,750,403 | B2 | 7/2010 | Shionoiri et al. |
| 7,858,455 | B2 * | 12/2010 | Yamazaki .......... 438/152 |
| 8,044,399 | B2 * | 10/2011 | Hino et al. .......... 257/59 |
| 8,088,653 | B2 | 1/2012 | Kim et al. |
| 2004/0135143 | A1 | 7/2004 | Harano et al. |
| 2005/0249525 | A1 | 11/2005 | Harano et al. |
| 2005/0250273 | A1 | 11/2005 | Harano et al. |
| 2006/0118793 | A1 | 6/2006 | Yang et al. |
| 2006/0210323 | A9 | 9/2006 | Ito |
| 2007/0096097 | A1 | 5/2007 | Kim et al. |
| 2008/0001228 | A1 | 1/2008 | Shionoiri et al. |
| 2009/0098673 | A1 | 4/2009 | Yang et al. |

(Continued)

FOREIGN PATENT DOCUMENTS

JP 2000-208773 7/2000
JP 2004-214581 7/2004

(Continued)

OTHER PUBLICATIONS

International Search Report in PCT/JP2011/006640, dated Mar. 6, 2012.

*Primary Examiner* — Hung Vu
(74) *Attorney, Agent, or Firm* — Greenblum & Bernstein, P.L.C.

(57) ABSTRACT

A thin-film transistor according to the present disclosure includes: a substrate; a gate electrode above the substrate; a gate insulating layer on the gate electrode; a channel layer on the gate insulating layer which is located on the gate electrode; a source electrode above the channel layer; a drain electrode above the channel layer; and a barrier layer between the channel layer and the source electrode and between the channel layer and the drain electrode. Each of the source electrode and the drain electrode is made of a metal including copper, and the barrier layer contains nitrogen and molybdenum and has a density greater than 7.5 g/cm$^3$ and less than 10.5 g/cm$^3$.

9 Claims, 11 Drawing Sheets

(56) References Cited

U.S. PATENT DOCUMENTS

| | | |
|---|---|---|
| 2009/0218568 A1* | 9/2009 | Dairiki et al. .................. 257/57 |
| 2010/0062574 A1 | 3/2010 | Kim et al. |
| 2010/0244258 A1 | 9/2010 | Ito et al. |
| 2012/0025224 A1 | 2/2012 | Yuasa |

FOREIGN PATENT DOCUMENTS

| | | |
|---|---|---|
| JP | 2006-165520 | 6/2006 |
| JP | 2007-123906 | 5/2007 |
| JP | 2008-034819 | 2/2008 |
| WO | 2009/078254 | 6/2009 |

\* cited by examiner

FIG. 5A
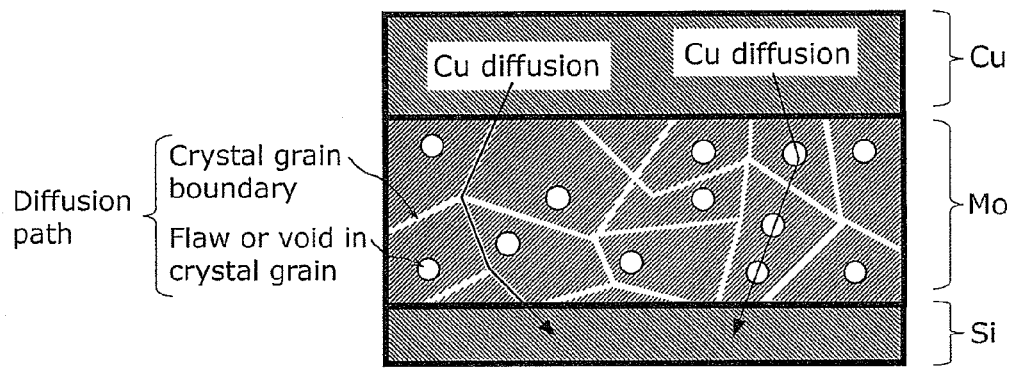
FIG. 5B
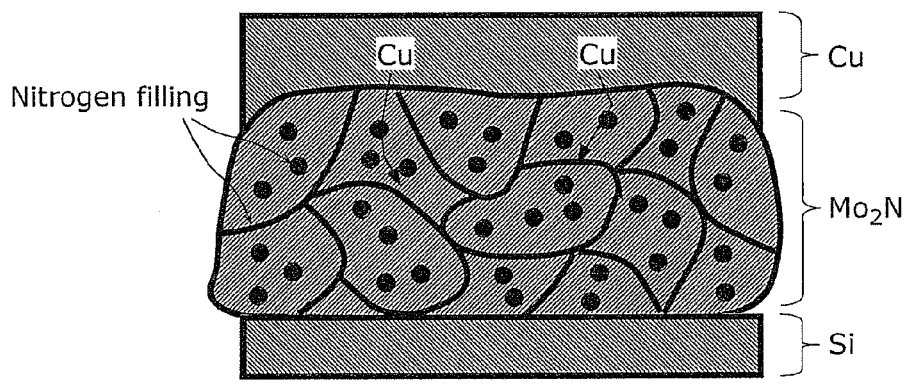
FIG. 6A
| Film formation condition | Ar flow rate [sccm] | 22 | | | | | | |
|---|---|---|---|---|---|---|---|---|
| | N₂ flow rate [sccm] | 0 | 10 | 20 | 30 | 40 | 60 | 80 |
| | Gas flow rate ratio (N₂: Ar) | 0 | 0.45:1 | 0.91:1 | 1.4:1 | 1.8:1 | 2.7:1 | 3.6:1 |
| | N₂ flow rate ratio (N₂/(Ar+N₂)) | 0.00 | 0.31 | 0.48 | 0.58 | 0.65 | 0.73 | 0.78 |
| | Pressure [Pa] | 0.13 | 0.15 | 0.18 | 0.21 | 0.23 | 0.30 | 0.36 |
| | Temperature [°C] | RT (Room temperature) | | | | | | |
| Mo₂N | Film density [g/cm³] | 10.5 | 9.6 | 9.4 | 9.3 | 9.2 | 9.0 | 8.8 |
| | Barrier property | No | Yes | Yes | Yes | Yes | Yes | Yes |

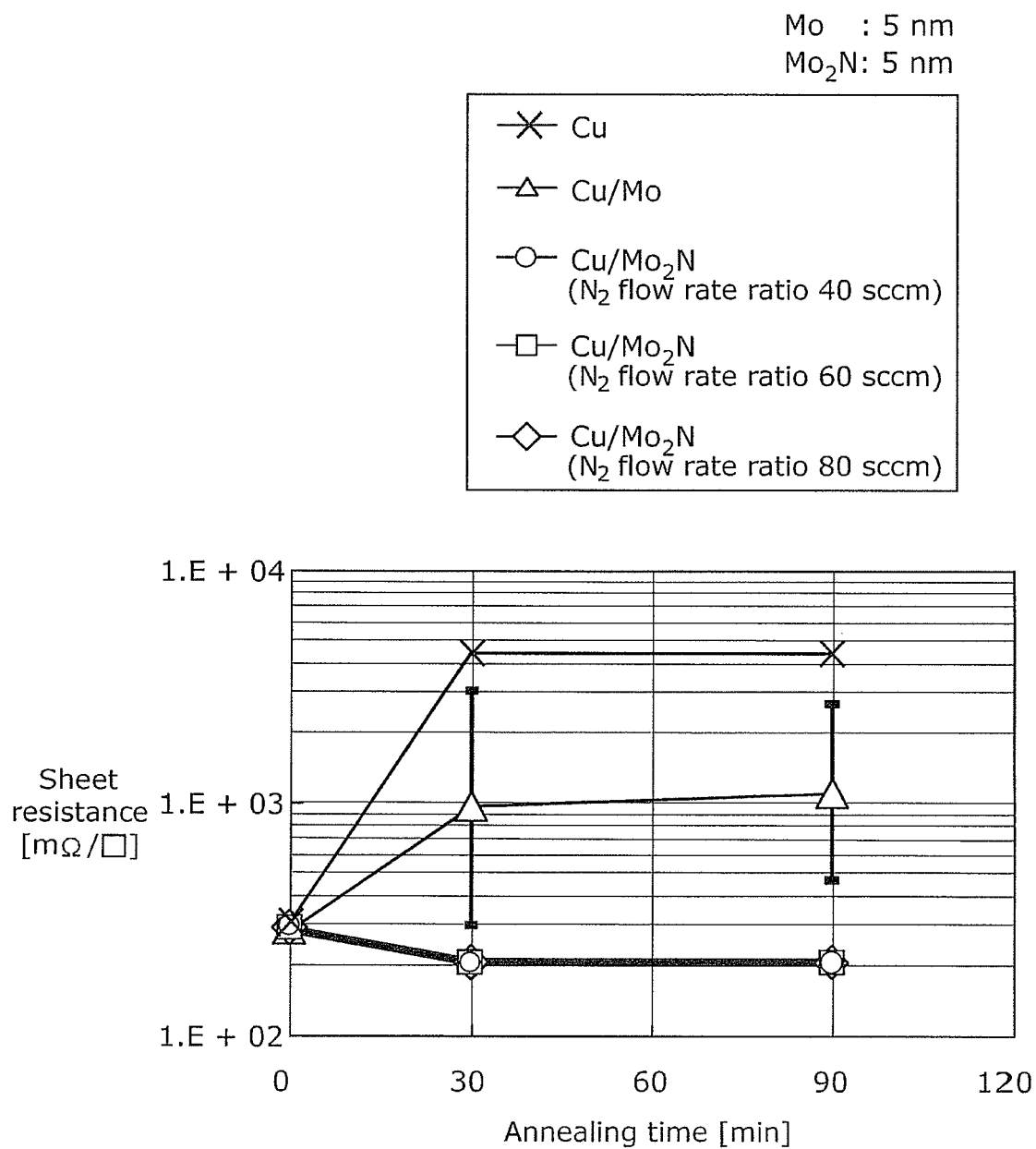

THIN-FILM TRANSISTOR AND THIN-FILM TRANSISTOR MANUFACTURING METHOD

CROSS REFERENCE TO RELATED APPLICATION

This is a continuation application of PCT Patent Application No. PCT/JP2011/006640 filed on 29, Nov. 2011, designating the United States of America. The entire disclosure of the above-identified application, including the specification, drawings and claims are incorporated herein by reference in its entirety.

TECHNICAL FIELD

Devices and methods consistent with one or more exemplary embodiments of the present disclosure relate to thin-film transistors and thin-film transistor manufacturing methods.

BACKGROUND ART

In recent years, as one of next-generation flat panel displays in place of liquid-crystal display apparatuses, attention has been given to organic electroluminescence (EL) display apparatuses which use EL of organic materials. An active-matrix display device such as an organic EL display apparatus includes thin-film transistors (TFTs) in respective pixels arranged in rows and columns, which form a TFT array substrate.

Each of the thin-film transistors includes, above the substrate, a gate electrode, a semiconductor layer (a channel layer), a source electrode, and a drain electrode, and is used as a driver transistor or a switching transistor in each of the pixels of the TFT array substrate. Furthermore, a metal of which each electrode of the thin-film transistor is made is used also as a wiring line; the metal of the source electrode is used also as a source line, and the metal of the drain electrode is used also as a drain line, for example. In other words, the source electrode or the drain electrode and the source line or the drain line are formed by patterning of the same metal film.

Recent years have seen a demand for a decrease in line resistance along with an increase in size of a screen of the display apparatus and have developed studies on a copper line which uses low-resistance copper (Cu) as a material of the source line or the drain line. In this case, the source electrode or the drain electrode which is formed in the same layer as the source line or the drain line will be formed of copper.

However, the use of copper as a material of the source electrode or the drain electrode causes a problem of thermal diffusion of copper which occurs due to heat taken in during a thermal process or heat generated during an operation of TFT, resulting in an adverse effect of diffused copper on the semiconductor layer. Thus, in order that copper is prevented from being diffused into the semiconductor layer, there is conventionally a proposed technique of forming, between the source electrode (the drain electrode) and the semiconductor layer, a barrier layer which includes a molybdenum film or a conventional molybdenum nitride film.

Furthermore, PTL 1 discloses a thin-film transistor in which, under a protective film, a cover layer containing silicon is formed as a barrier layer in order that copper which forms a copper line on the protective film is prevented from being diffused into a lower conductive layer.

CITATION LIST

Patent Literature

[Patent Literature 1] Japanese Unexamined Patent Application Publication No. 2006-165520

SUMMARY OF INVENTION

Technical Problem

However, the conventional technique has a problem of a failure to obtain sufficient barrier properties with a thinned barrier layer.

One or more exemplary embodiments are conceived in view of the aforementioned problem and provide a thin-film transistor and a thin-film transistor manufacturing method in which a barrier layer which, even when thinned, has sufficient barrier properties is included.

Solution to Problem

In one general aspect, the techniques disclosed here feature a thin-film transistor which includes: a substrate; a gate electrode above the substrate; a gate insulating layer on the gate electrode; a semiconductor layer on the gate insulating layer which is located on the gate electrode; a source electrode above the semiconductor layer; a drain electrode above the semiconductor layer; and a barrier layer between the semiconductor layer and the source electrode and between the semiconductor layer and the drain electrode, wherein each of the source electrode and the drain electrode comprises a metal including copper, and the barrier layer contains nitrogen and molybdenum and has a density greater than 7.5 g/cm$^3$ and less than 10.5 g/cm$^3$.

Advantageous Effects of Invention

One or more exemplary embodiments of the present disclosure enable the implementation of a thin-film transistor including a barrier layer which, even when thinned, has barrier properties.

BRIEF DESCRIPTION OF DRAWINGS

These and other advantages and features of exemplary embodiments of the present disclosure will become apparent from the following description thereof taken in conjunction with the accompanying Drawings that illustrate general and specific exemplary embodiments of the present disclosure. In the Drawings.

Figure 4A:
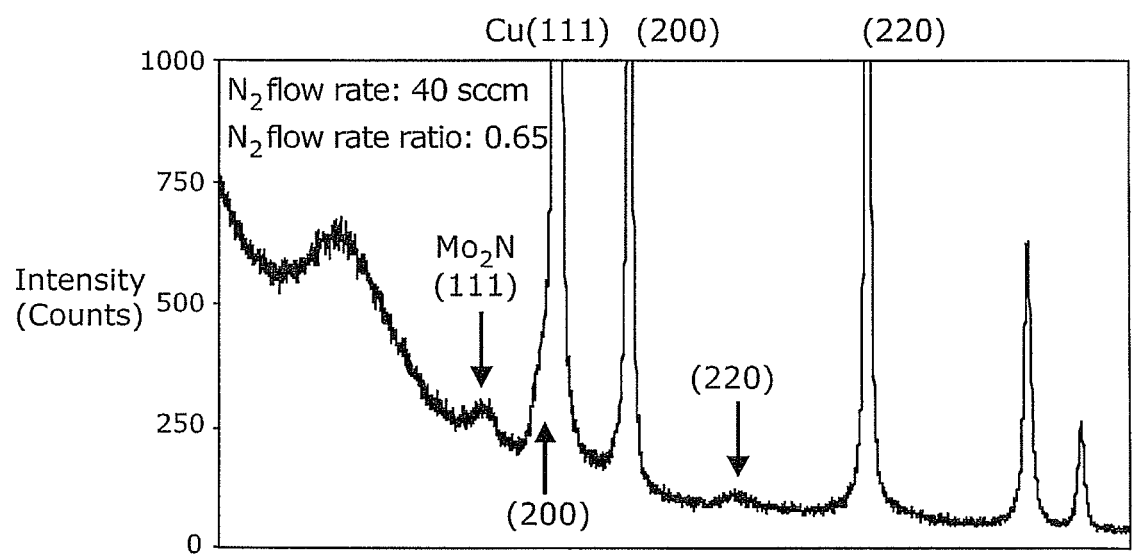
Figure 4B:
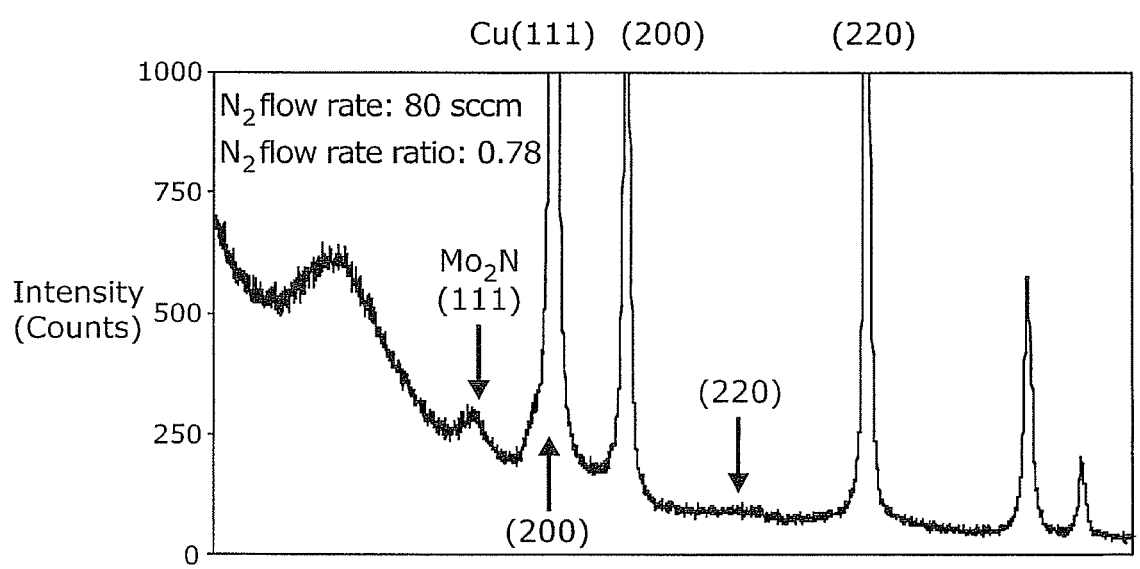
Figure 6B:
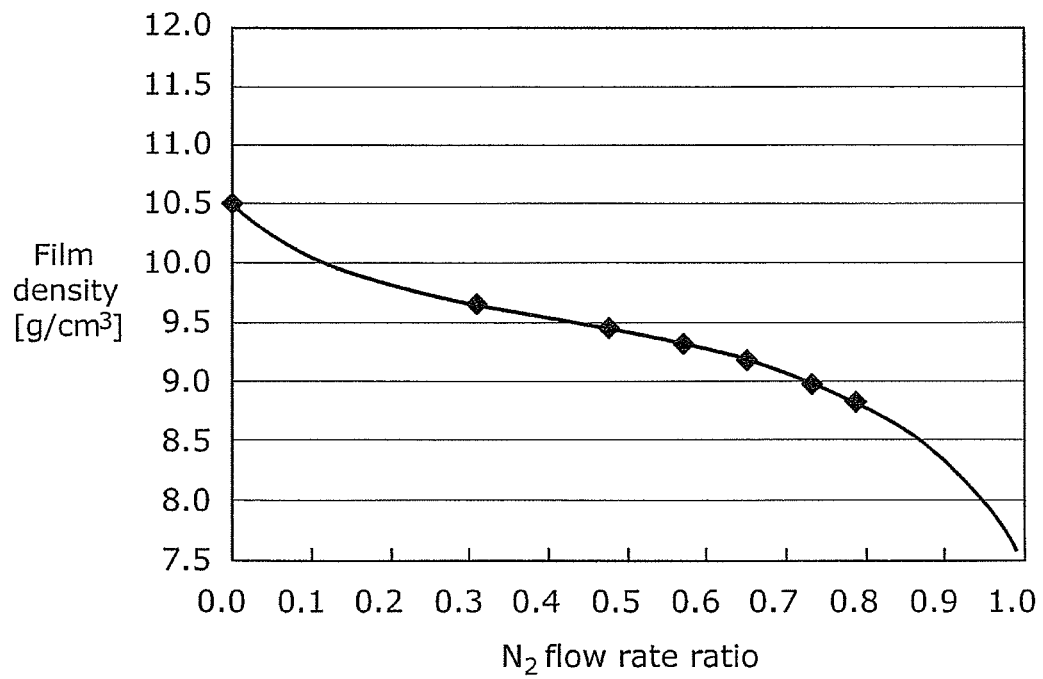
Figure 7A:
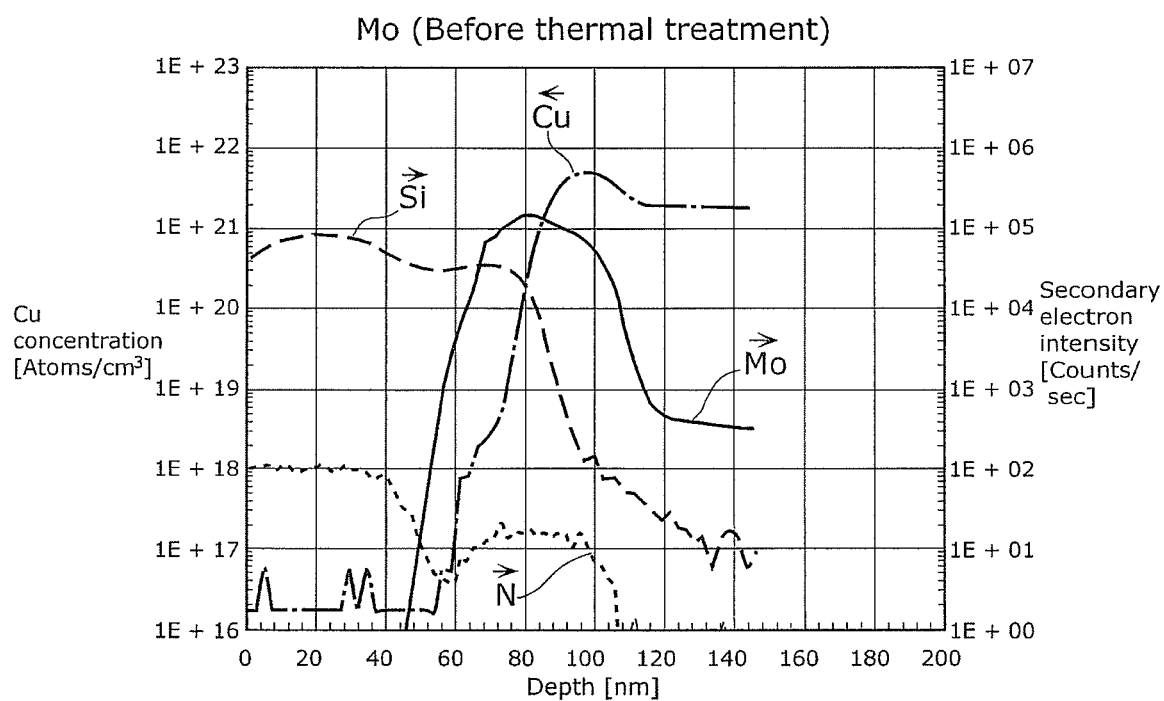
Figure 7B:
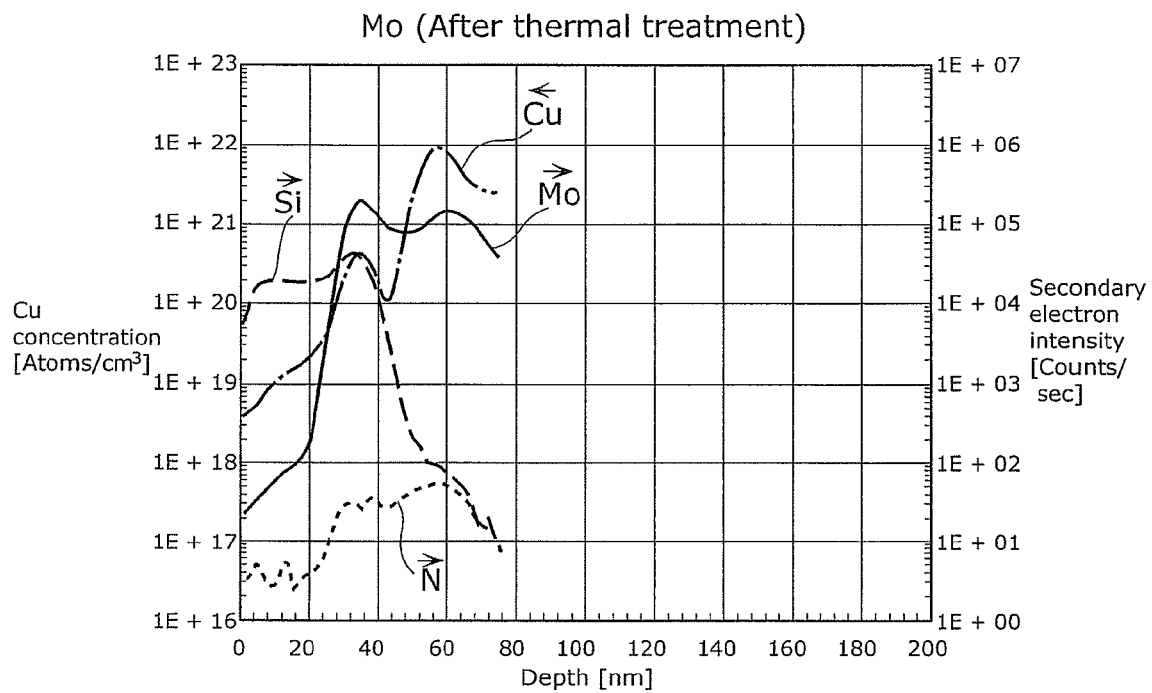
Figure 8A:
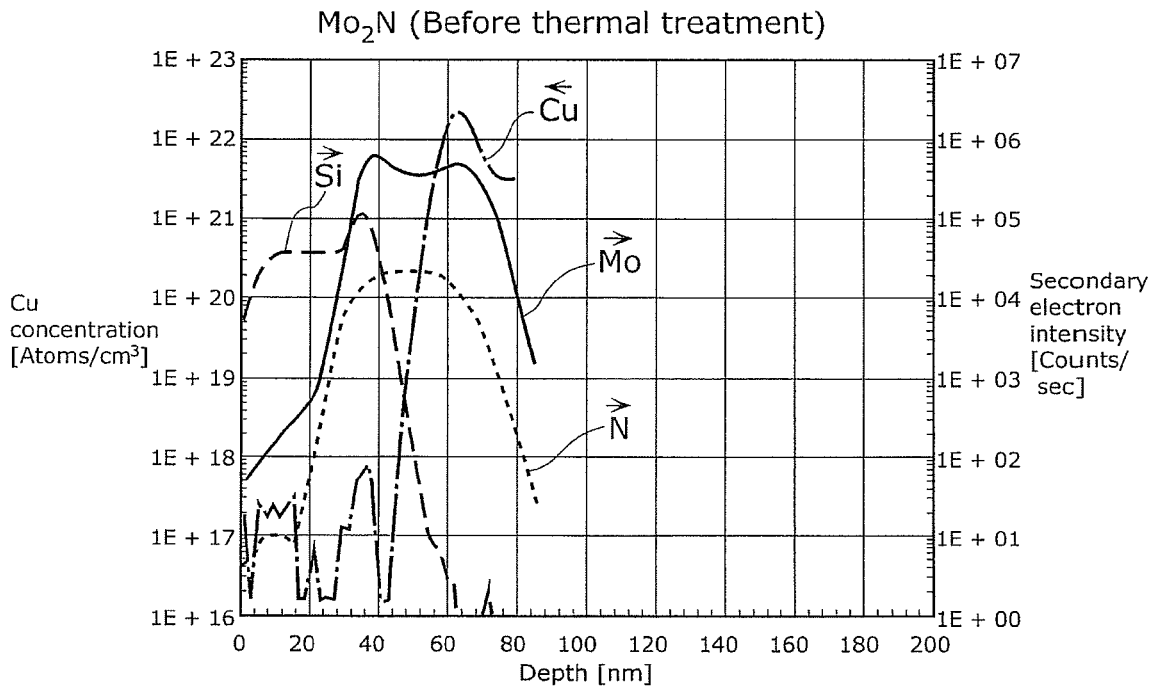
Figure 8B:
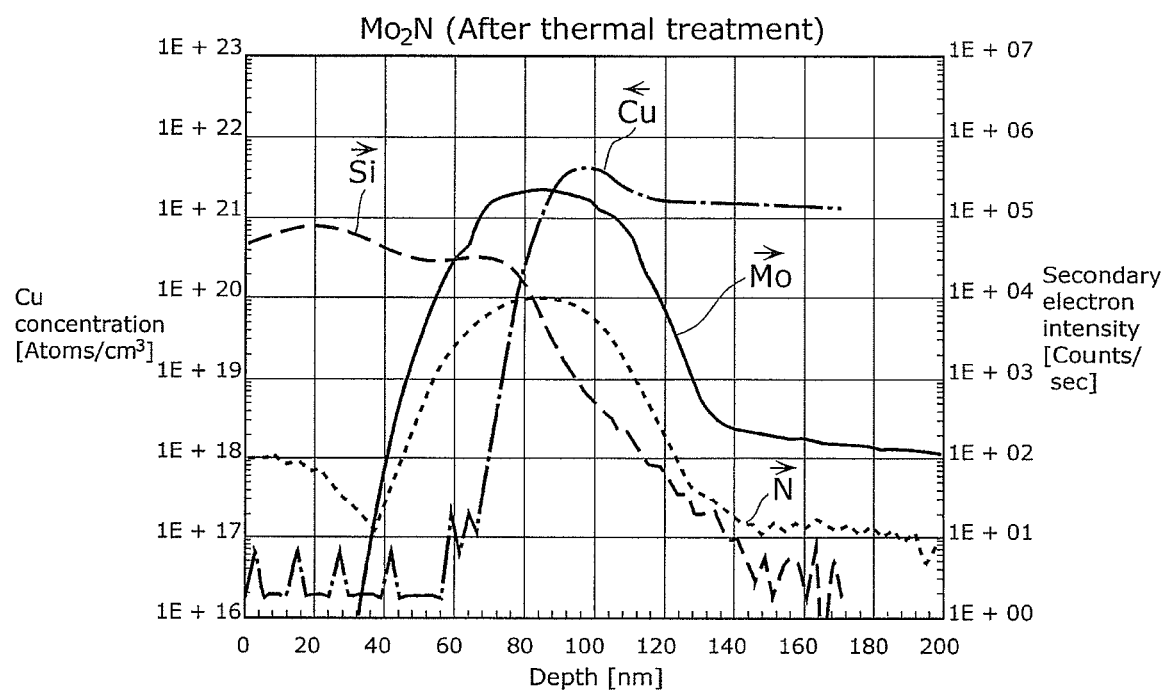
Figure 10:
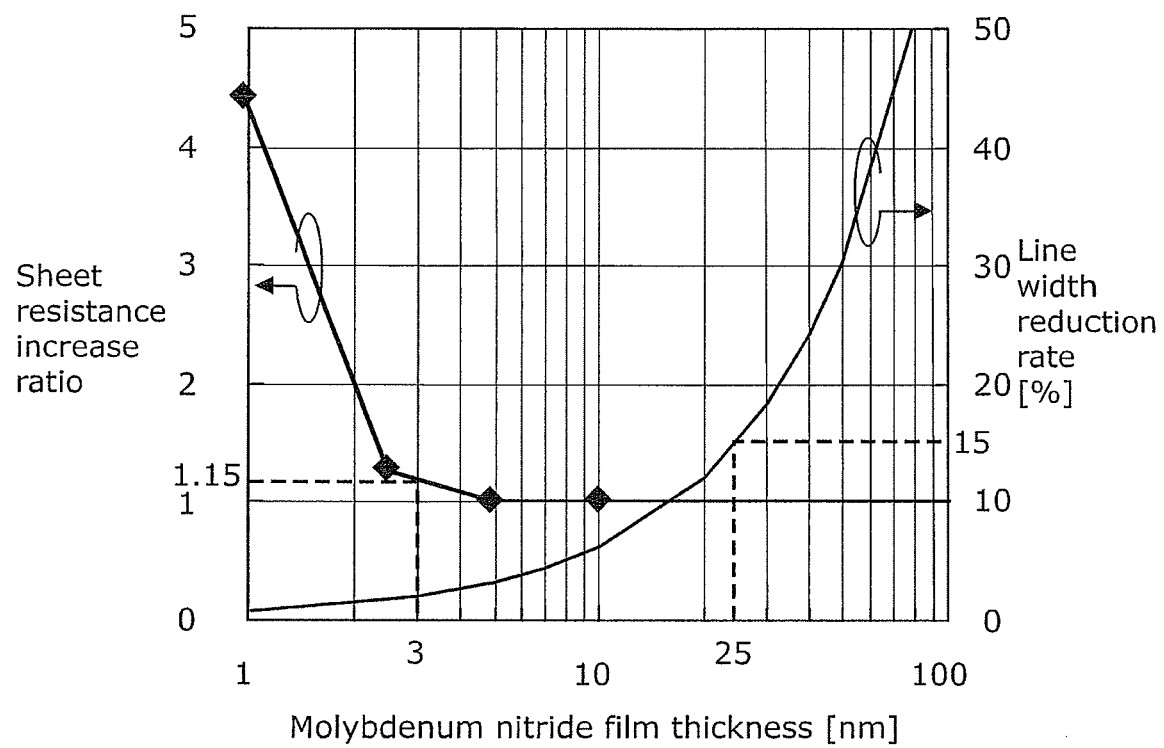
Figure 11:
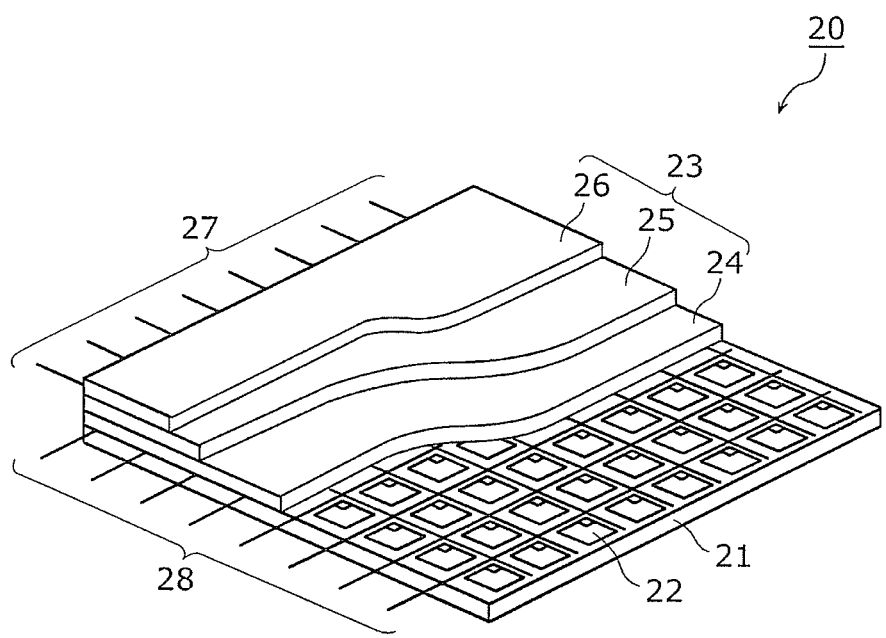
Figure 12:
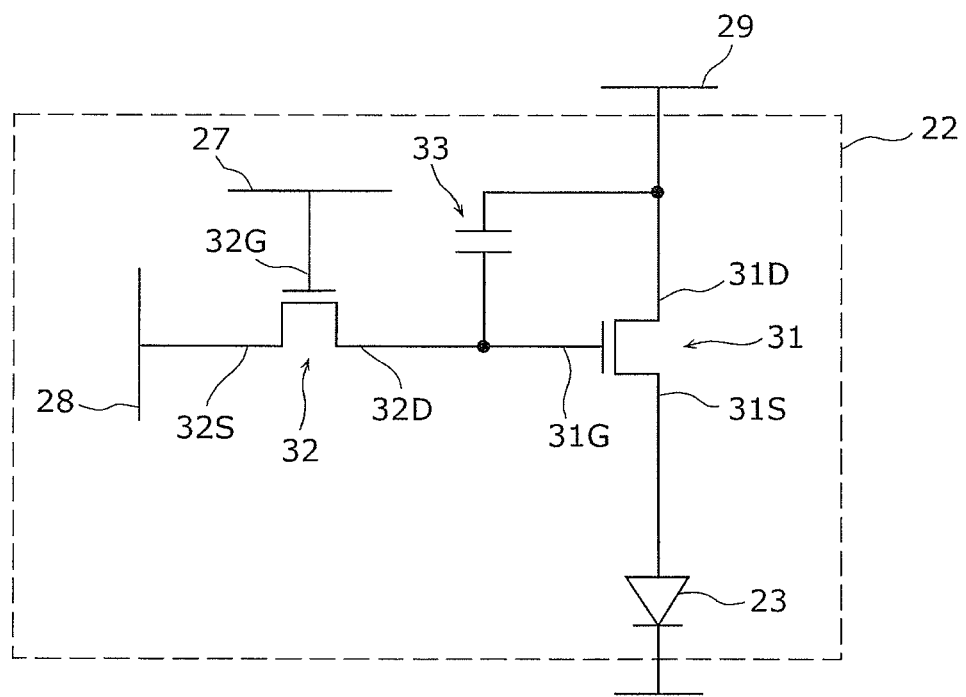

FIG. 4A shows an X-ray diffraction (XRD) spectrum of a sample including a molybdenum nitride film (having a nitrogen flow rate of 40 sccm and an argon flow rate of 22 sccm) in an embodiment of the present disclosure;

FIG. 4B shows an XRD spectrum of a sample including a molybdenum nitride film (having a nitrogen flow rate of 80 sccm and an argon flow rate of 22 sccm) in an embodiment of the present disclosure;

FIG. 5A schematically shows a structure of a typical molybdenum film;

FIG. 5B schematically shows a structure of a molybdenum nitride film in an embodiment of the present disclosure;

FIG. 6A shows a plurality of film formation conditions which are applied in forming a 10 nm-thick molybdenum nitride film (a barrier layer), and film densities and barrier properties of the molybdenum nitride film formed under such conditions, in a thin-film transistor according to an embodiment of the present disclosure;

FIG. 6B shows a relationship between a nitrogen flow rate ratio which is applied in forming a 10 nm-thick molybdenum nitride film, and a film density of the formed molybdenum nitride film, in a thin-film transistor according to an embodiment of the present disclosure;

FIG. 7A shows a secondary ion mass spectrometry (SIMS) measurement result of elements contained in a film included in a thin-film transistor (before thermal treatment) according to a comparison example in which a barrier layer is a molybdenum film;

FIG. 7B shows an SIMS measurement result of the elements contained in the film included in the thin-film transistor (after thermal treatment) according to a comparison example in which the barrier layer is a molybdenum film;

FIG. 8A shows an SIMS measurement result of elements contained in a film included in a thin-film transistor (before thermal treatment) according to an embodiment of the present disclosure in which a barrier layer is a molybdenum nitride film;

FIG. 8B shows an SIMS measurement result of the elements contained n the film included in the thin-film transistor (after thermal treatment) according to the embodiment of the present disclosure in which the barrier layer is a molybdenum nitride film;

FIG. 9 shows a relationship between annealing time and sheet resistance for a laminate film which includes a barrier layer and a source electrode (a drain electrode) formed of a copper film in a thin-film transistor;

FIG. 10 shows film-thickness dependency of the molybdenum nitride film on a sheet resistance increase ratio and a line width reduction ratio for the laminate film which includes the barrier layer and the source electrode (the drain electrode) formed of a copper film in the thin-film transistor;

FIG. 11 is a partial cutaway perspective view of an organic EL display apparatus according to an embodiment of the present disclosure; and FIG. 12 shows circuitry of a pixel which uses a thin-film transistor according to an embodiment of the present disclosure.

DESCRIPTION OF EMBODIMENT(S)

Underlying Knowledge Forming Basis of the Present Disclosure

Device requirements for a thin-film transistor include a low cost, the workability of wet etching, a reduction in off-state leakage current, and so on. For example, a thin-film transistor including a barrier layer must meet these requirements.

In this case, in order that a barrier layer meets the requirements of a low cost and the workability of wet etching, the barrier layer needs to be thinner.

Meanwhile, in order that the barrier layer meets the requirement of a reduction in off-state leakage current, the barrier layer needs to be thicker because the diffusion of copper contained in a source or drain electrode needs to be suppressed to obtain sufficient barrier properties.

Thus, the barrier layer which prevents a metal contained in a source or drain electrode from being diffused faces a challenge of satisfying such trade-off requirements of an increase and a decrease in film thickness. In this case, a conventional technique in which a barrier layer formed of a molybdenum film is provided between a source or drain electrode and a semiconductor layer fails to provide sufficient barrier properties when the barrier layer is thinned.

One or more exemplary embodiments are conceived in view of the aforementioned problem and provide a thin-film transistor and a thin-film transistor manufacturing method in which a barrier layer which, even when thinned, has sufficient barrier properties is included.

In one general aspect, the techniques disclosed here feature a thin-film transistor which includes: a substrate; a gate electrode above the substrate; a gate insulating layer on the gate electrode; a semiconductor layer on the gate insulating layer which is located on the gate electrode; a source electrode above the semiconductor layer; and a drain electrode above the semiconductor layer; and a barrier layer between the semiconductor layer and the source electrode and between the semiconductor layer and the drain electrode, wherein each of the source electrode and the drain electrode comprises a metal including copper, and the barrier layer contains nitrogen and molybdenum and has a density greater than 7.5 g/cm$^3$ and less than 10.5 g/cm$^3$.

According to an exemplary embodiment of the present disclosure, even when a barrier layer formed between a source or drain electrode and a semiconductor layer is thinned, the diffusion of copper contained in the source or drain electrode can be blocked by the barrier layer. With this, the copper contained in the source or drain electrode can be prevented from entering the semiconductor layer.

Furthermore, in a thin-film transistor according to an exemplary embodiment of the present disclosure, for example, a composition ratio of nitrogen to molybdenum contained in the barrier layer is greater than 0.9.

Furthermore, in a thin-film transistor according to an exemplary embodiment of the present disclosure, for example, the barrier layer has a structure including: a plurality of crystal grains comprising $Mo_2N$; and nitrogen contained in between the crystal grains.

Furthermore, in a thin-film transistor according to an exemplary embodiment of the present disclosure, for example, the barrier layer has a thickness of no less than 2 nm and no less than 30 nm. Furthermore, in a thin-film transistor according to an exemplary embodiment of the present disclosure, for example, the barrier layer has a thickness of no less than 3 nm and no more than 25 nm.

Furthermore, in a thin-film transistor according to an exemplary embodiment of the present disclosure, for example, a contact layer is provided between the semiconductor layer and the barrier layer.

Furthermore, in one general aspect, the techniques disclosed here feature a thin-film transistor manufacturing method which includes: preparing a substrate having a semiconductor layer; forming, above the semiconductor layer, a barrier layer including a molybdenum nitride film; and forming, on the barrier layer, a source electrode and a drain electrode from a metal including copper, wherein in the forming of a barrier layer, the substrate and a molybdenum target are placed in a sputtering device and the molybdenum target is sputtered in an unheated state by introducing nitrogen gas and an inert gas, to thereby form the molybdenum nitride film which has a density greater than 7.5 g/cm$^3$ and less than 10.5 g/cm$^3$.

According to this exemplary embodiment, the sputtering is performed in an unheated state by introducing nitrogen gas and an inert gas introduced, to thereby form a barrier layer including a molybdenum nitride film which has a density greater than 7.5 (g/cm$^3$) and less than 10.5 (g/cm$^3$), with the result that even such a thin barrier layer can exhibit barrier properties.

Furthermore, in a thin-film transistor manufacturing method according to an exemplary embodiment of the present disclosure, for example, the inert gas is argon gas, and in the forming of a barrier layer, a gas flow rate ratio of the nitrogen gas to the argon gas is set to no less than 1.6 to form the barrier layer.

Furthermore, in a thin-film transistor manufacturing method according to an exemplary embodiment of the present disclosure, for example, the sputtering in the unheated state in the forming of a barrier layer is performed at room temperature.

Hereinafter, a thin-film transistor and a thin-film transistor manufacturing method in exemplary embodiments of the present disclosure are described with reference to the accompanying Drawings. Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the inventive concept, the scope of which is defined in the appended Claims and their equivalents. Therefore, among the structural elements in the following exemplary embodiments, structural elements not recited in any one of the independent claims defining the most generic part of the inventive concept are not necessarily required to overcome conventional disadvantages, but are described as an example. Furthermore, throughout the drawings, elements having substantially the same structures, operations, and effects are denoted by the same numerals.

(Embodiment)

Figure 1:
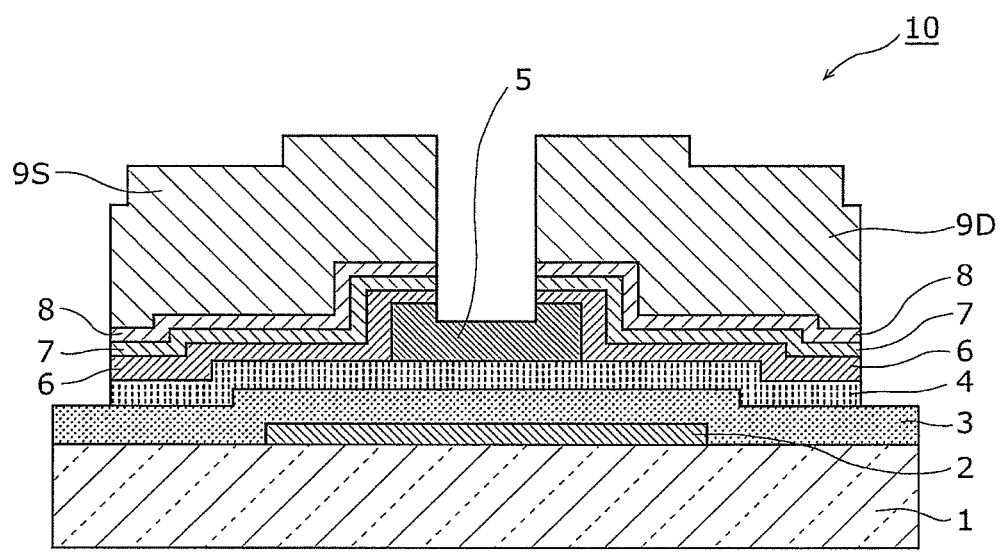
FIG. 1 is a cross-sectional view schematically showing a structure of a thin-film transistor according to an embodiment of the present disclosure.

First, a structure of a thin-film transistor 10 according to an embodiment of the present disclosure shall be described with reference to FIG. 1. FIG. 1 is a cross-sectional view schematically showing a structure of the thin-film transistor according to the embodiment of the present disclosure.

As shown in FIG. 1, the thin-film transistor 10 according to the embodiment of the present disclosure is a channel-protected, bottom-gate thin-film transistor and includes a substrate 1 and, sequentially above the substrate 1, a gate electrode 2, a gate insulating layer 3, a channel layer (semiconductor layer) 4, and a channel protecting layer 5. The thin-film transistor 10 further includes, above the channel layer 4 and across the channel protecting layer 5: a pair of non-crystalline semiconductor layers 6; a pair of contact layers 7 formed on the respective semiconductor layers 6; a pair of barrier layers 8 formed on the respective contact layers 7; and a pair of a source electrode 9S and a drain electrode 9D formed on the respective barrier layers 8.

Each structural element of the thin-film transistor 10 according to this embodiment shall be described in detail below.

The substrate 1 is, for example, a glass substrate made of a glass material such as silica glass, alkali-free glass, or highly heat-resistant glass. It is to be noted that a substrate having a surface on which an undercoat layer made of silicon nitride (SiN$_x$), silicon oxide (SiO$_y$), silicon oxynitride (SiO$_y$N$_x$) or the like is formed may be used in order that impurities such as sodium or phosphorus contained in the glass substrate are prevented from entering the channel layer 4. Furthermore, the undercoat layer also plays a role of reducing the effect of heat on the substrate 1 in a high-temperature thermal treatment process such as laser annealing. The thickness of the undercoat layer can be around 100 nm to 2000 nm, for example.

The gate electrode 2 is formed in a predetermined shape above the substrate 1. The gate electrode 2 has a single-layer or multilayer structure made of a conductive material resistant to the melting-point temperature of silicon or made of an alloy of the conductive material and may use, for example, molybdenum (Mo), aluminum (Al), copper (Cu), tungsten (W), tantalum (Ta), niobium (Nb), nickel (Ni), titanium (Ti), chromium (Cr), molybdenum tungsten (MoW), or the like. The gate electrode 2 is formed in a manner that a gate metal film made of such material is formed above the substrate 1 and then patterned into a predetermined shape. The thickness of the gate electrode 2 can be around 20 nm to 500 nm, for example.

The gate insulating layer 3 is a gate insulating film formed on the gate electrode 2. In this embodiment, the gate insulating layer 3 is formed over an entire surface above the substrate 1 so as to cover the gate electrode 2, that is, is formed across the substrate 1 and the gate electrode 2. The gate insulating layer 3 may be formed using, for example, silicon oxide, silicon nitride, silicon oxynitride, aluminum oxide (AlO$_z$), or tantalum oxide (TaO$_w$), or a laminate of these materials.

In this embodiment, since the channel layer 4 uses a thin crystalline silicon film, the gate insulating layer 3 uses at least silicon oxide, for example. This is because silicon oxide is suitable for placing an interface between the channel layer 4 and the gate insulating layer 3 in a favorable state in order to maintain good threshold voltage characteristics in a TFT. The thickness of the gate insulating layer 3 can be around 50 nm to 300 nm, for example.

The channel layer 4 includes a thin crystalline semiconductor film formed on the gate insulating layer 3 and has a channel region in which the movement of carriers is controlled according to a voltage of the gate electrode 2. In this embodiment, at least the channel region of the channel layer 4 is formed of a thin crystalline silicon film including a thin polycrystalline silicon film, and is a crystalline region formed by changing a thin non-crystalline silicon film (an amorphous silicon film), which is a precursor, into polycrystalline state (including microcrystalline state) through laser irradiation.

It is to be noted that the channel layer 4 may be a thin crystalline silicon film having a mixed crystal structure which contains non-crystalline silicon and crystalline silicon. In this case, at least a predetermined channel region of the channel layer 4 is formed of a film having a high ratio of crystalline silicon, for example, in order to obtain superior on-state characteristics. The thickness of the channel layer 4 can be around 20 nm to 100 nm, for example. In addition, the orientation of a principal surface of crystal silicon contained in the channel layer 4 is [100], for example.

Furthermore, the crystals contained in the channel layer 4 have an average grain size of no less than 5 nm and no more than 1000 nm (1 μm); the channel layer 4 may contain polycrystals with an average grain size of no less than 100 nm or small crystals called microcrystals (μc) with an average grain size of 10 nm to 100 nm.

The channel protecting layer 5 is an insulating film formed on the channel layer 4 and serves as a protective film which protects the channel region of the channel layer 4. Specifically, the channel protecting layer 5 functions as a channel etching stopper (CES) layer for preventing undesirable etching of the channel layer 4 in an etching process in which the pair of non-crystalline semiconductor layers 6 and the pair of contact layers 7 are formed. It is to be noted that the channel protecting layer 5 has insulating properties.

Furthermore, the channel protecting layer 5 can be an organic material layer made of an organic material or be an inorganic material layer made of an inorganic material. In the case where the channel protecting layer 5 includes the organic material layer, the organic material which mainly contains silicon, oxygen, and carbon can be used, for example. Specifically, a photosensitive organic material of coating type which contains an organic resin material, a surfactant, a solvent, and a photosensitizing agent can be used. In the case where the channel protecting layer 5 includes the inorganic material layer, the organic material such as silicon oxide ($SiO_x$) or silicon nitride ($SiN_y$) can be used. The pair of non-crystalline semiconductor layers 6 are formed at least on the channel layer 4 on both sides of the channel protecting layer 5 and are disposed face-to-face at a predetermined distance across the channel protecting layer 5. In this embodiment, each of the pair of the non-crystalline semiconductor layers 6 is formed so as to extend from an upper end part of the channel protecting layer 5 to the upper surface of the channel layer 4; the non-crystalline semiconductor layer 6 is formed so as to cover the upper and side surfaces of the channel protecting layer 5 and the upper surface of the channel layer 4.

Furthermore, the pair of non-crystalline semiconductor layers 6 are intrinsic non-crystalline semiconductor layers with no intentional doping of impurities and are intrinsic amorphous silicon films in this embodiment. The configuration is designed such that the band gap of the non-crystalline semiconductor layer 6 is greater than the band gap of the channel layer 4. The thickness of the non-crystalline semiconductor layer 6 can be around 10 nm to 100 nm, for example.

The pair of contact layers 7 are non-crystalline semiconductor films containing impurities and are formed between the channel layer 4 and respective ones of the pair of barrier layers 8. In this embodiment, the pair of contact layers 7 are formed on respective ones of the pair of non-crystalline semiconductor layers 6 and are disposed face-to-face at a predetermined distance across the channel protecting layer 5. Furthermore, the side surfaces of each of the pair of contact layers 7 agree with the respective side surfaces of a corresponding one of the pair of non-crystalline semiconductor layers 6.

The pair of contact layers 7 may include, for example, n-type semiconductor films obtained by introducing phosphorus (P), i.e., impurities, into amorphous silicon and are n+ layers each containing a high concentration of impurities in the range greater than or equal to $1 \times 10^{19}$ [atm/cm$^3$]. The thickness of each of the pair of contact layers 7 can be around 5 nm to 100 nm, for example.

The pair of barrier layers 8 are block layers each of which blocks a metal or the like that attempts to pass through the barrier layer 8, and one of the barrier layers 8 is formed between the channel layer 4 and the source electrode 9S while the other is formed between the channel layer 4 and the drain electrode 9D. In this embodiment, the pair of barrier layers 8 are formed on respective ones of the pair of contact layers 7 and are disposed face-to-face at a predetermined distance across the channel protecting layer 5. Furthermore, the side surfaces of each of the pair of barrier layers 8 agree with the respective side surfaces of a corresponding one of the pair of contact layers 7 and with the respective side surfaces of a corresponding one of the source electrode 9S and the drain electrode 9D.

The pair of barrier layers 8 are barrier metal layers each of which contains nitrogen (N) and molybdenum (Mo) and are molybdenum nitride films in this embodiment. Furthermore, the film density of the barrier layer 8 is less than the film density of a molybdenum film and is greater than 7.5 (g/cm$^3$) and less than 10.5 (g/cm$^3$).

Furthermore, a composition ratio (N/Mo) of nitrogen to molybdenum contained in the barrier layer 8 in this embodiment is greater than 0.9, and the barrier layer 8 in this embodiment includes a molybdenum nitride film made of $Mo_2N$. In addition, the film tissue of the barrier layer 8 has a structure in which nitrogen is contained among a plurality of crystal grains made of $Mo_2N$. The detailed structure of the barrier layer 8 will be described later.

The pair of the source electrode 9S and the drain electrode 9D are formed on respective ones of the pair of barrier layers 8 and are disposed above the channel region of the channel layer 4 so as to face each other at a predetermined distance across the channel protecting layer 5. Specifically, the source electrode 9S is formed above one of the ends of the channel layer 4 (the channel region) across one of the barrier layers 8, and the drain electrode 9D is formed above the other end of the channel layer 4 (the channel region) across the other barrier layer 8.

Furthermore, each of the source electrode 9S and the drain electrode 9D is made of a metal including at least copper (Cu) and can be formed of a copper film made of copper only or be formed of a copper alloy film made of a copper alloy, for example. It is to be noted that the each of the source electrode 9S and the drain electrode 9D can have a multilayer structure instead of a single-layer structure and may have a laminate structure which includes a material other than copper and a copper alloy and a copper metal film such as a copper film and a copper alloy film. In this case, the copper metal film may be the bottom layer (the contact layer 7-side or channel layer 4-side layer) in each of the source electrode 9S and the drain electrode 9D or may be the top layer in each of the source electrode 9S and the drain electrode 9D. It is to be noted that the entire film thickness of each of the source electrode 9S and the drain electrode 9D can be around 100 nm to 500 nm, for example.

Furthermore, a source line (not shown) connected to the source electrode 9S and a drain line (not shown) connected to the drain electrode 9D can be formed of a metal film which is used for the source electrode 9S and the drain electrode 9D, with the result that the source line and the drain line can be copper lines when copper is used as a metal material for the source electrode 9S and the drain electrode 9D.

Figure 2:
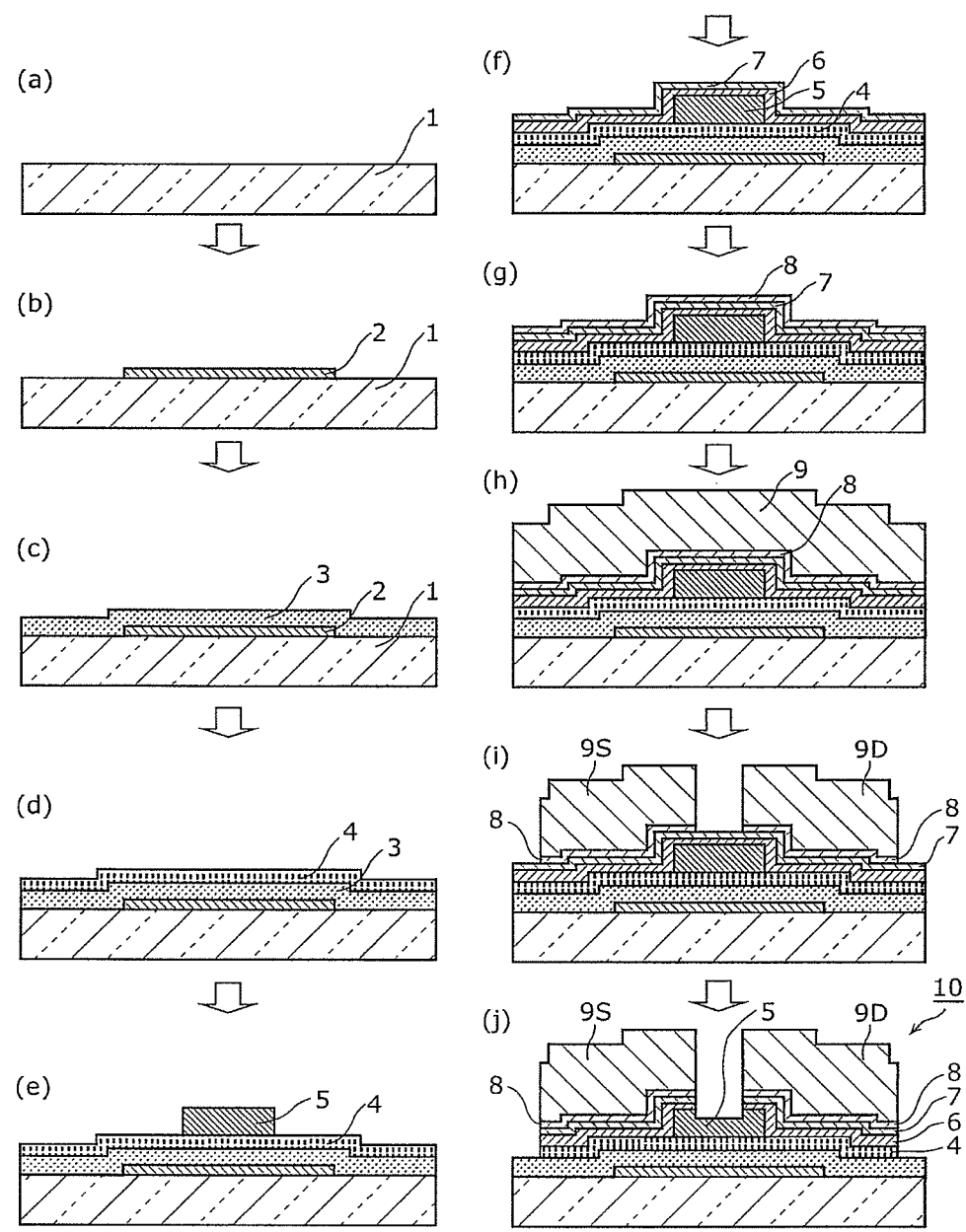
FIG. 2 is a cross-sectional view schematically showing a structure in each step of a thin-film transistor manufacturing method according to an embodiment of the present disclosure.

Next, a method of manufacturing the thin-film transistor 10 according to the embodiment of the present disclosure shall be described with reference to FIG. 2. FIG. 2 is a cross-sectional view schematically showing a structure in each step of a thin-film transistor manufacturing method according to the embodiment of the present disclosure.

The method of manufacturing the thin-film transistor 10 according to this embodiment includes: a step of preparing the substrate 1 having the channel layer 4; a step of forming, above the channel layer 4, the barrier layer 8 including a molybdenum nitride film; and a step of forming, on the barrier layer 8, the source electrode 9S and the drain electrode 9S from a metal including copper. Furthermore, in the step of forming the barrier layer 8, a molybdenum target and the substrate 1 having the channel layer 4 are placed in a sputtering device, and the molybdenum target is sputtered in an unheated state by introducing nitrogen gas and an inert gas, to thereby form the molybdenum nitride film.

Each step in the method of manufacturing the thin-film transistor 10 according to this embodiment shall be described in detail with reference to the Drawings.

First, as shown in (a) of FIG. 2, a glass substrate is prepared as the substrate 1. It is to be noted that before the gate electrode 2 is formed, an undercoat layer including a silicon nitride film, a silicon oxide film, a silicon oxynitride film, or the like may be formed on a surface of the substrate 1 by the plasma chemical vapor deposition (CVD) or the like. In addition, the step of preparing the substrate 1 includes, for example, a step of cleansing the substrate 1 other than the step of forming the undercoat layer.

Next, as shown in (b) of FIG. 2, the gate electrode 2 having a predetermined shape is formed above the substrate 1. For example, as the gate electrode 2, a gate metal film made of a high-melting-point metal including Mo or MoW or made of an alloy of such high-melting-point metal is formed above the substrate 1 by sputtering, and using the photolithography process and the wet etching process, patterning is performed on the gate metal film, with the result that the gate electrode 2 having the predetermined shape can be formed. The wet etching of MoW can be performed using a chemical in which phosphoric acid ($HPO_4$), nitric acid ($HNO_3$), acetic acid ($CH_3COOH$), and water are mixed in a predetermined proportion, for example. In the case where the undercoat layer is formed on a surface of the substrate 1, the gate electrode 2 is formed on the undercoat layer.

Next, as shown in (c) of FIG. 2, the gate insulting layer 3 is formed over the entire surface of the substrate 1 so as to cover the gate electrode 2. For example, as the gate insulating layer 3, a single-layer or laminate film such as a silicon oxide film or a silicon nitride film is formed on the gate electrode 2 by the plasma CVD.

Next, as shown in (d) of FIG. 2, the channel layer 4 is formed on the gate insulating layer 3. In this embodiment, a thin crystalline silicon film made of polycrystalline silicon is formed as the channel layer 4. In this case, first, a thin non-crystalline film made of, for example, amorphous silicon (non-crystalline silicon) is formed on the gate insulating layer 3 by the plasma CVD or the like, and after a dehydrogenation annealing process is performed, the thin non-crystalline film is annealed and thereby crystallized, with the result that the channel layer 4 including a thin crystalline silicon film can be formed. The thin non-crystalline silicon film can be formed, for example, by introducing silane gas ($SiH_4$) and hydrogen gas ($H_2$) in a predetermined concentration proportion.

It is to be noted that for the crystallization of the thin non-crystalline silicon film, it may be possible to apply, other than the laser annealing using an excimer laser at a wavelength around 190 nm to 350 nm, the laser annealing process using a pulse laser at a wavelength around 370 nm to 900 nm, the laser annealing process using a continuous wave laser at a wavelength of 370 nm to 900 nm, or the thermal annealing process through rapid thermal processing (RTP). In addition, instead of forming the thin crystalline silicon film by crystallizing the thin non-crystalline silicon film, it is also possible to form the thin crystalline silicon film by CVD-based direct growth or the like method.

After the crystallization, hydrogen plasma treatment is applied to the thin crystalline silicon film so that the silicon atoms of the thin crystalline silicon film are hydrotreated, for example. The hydrogen plasma treatment is applied as follows: for example, hydrogen plasma is generated by radio-frequency (RF) power using, as a raw material, gas such as $H_2$ or $H_2$/argon (Ar) which contains hydrogen gas, and with such hydrogen plasma, the thin crystalline silicon film is irradiated. This hydrogen plasma treatment causes dangling-bonds (defects) of silicon atoms to be hydrogen-terminated, with the result that the thin crystalline silicon film has a lowered crystal defect density and improved crystallinity.

Next, as shown in (e) of FIG. 2, the channel protecting layer 5 is formed on the channel layer 4. For example, a predetermined organic material is applied to the channel layer 4 by a predetermined coating method and is then baked, with the result that the channel protecting layer 5 including an organic film can be formed.

As the organic material for the channel protecting layer 5, an organic material mainly containing silicon, oxygen, and carbon can be used. More specifically, a photosensitive organic material of coating type which contains an organic resin material, a surfactant, a solvent, and a photosensitizing agent can be used, as mentioned above. In this case, first, the organic material is applied to the channel layer 4 by a coating method such as a spin coating method so that an organic film is formed over an entire surface on the channel layer 4. This is followed by, for example, pre-baking that is heating at a temperature of about 110 degrees Celsius about for 60 seconds so that the solvent contained in the organic film is gasified. The organic film is then patterned into a predetermined shape by exposure and development using a photo mask. As a developer, a 2.38% tetramethylammonium hydroxide (TMAH) solution can be used, for example. Afterward, the organic film is solidified through post-baking that is heating at a temperature of 280 to 300 degrees Celsius about for an hour. By do doing, the channel protecting layer 5 including an organic film in a predetermined shape can be formed.

In the case of forming the channel protecting layer 5 using an inorganic material layer, for example, an organic film of silicon oxide ($SiO_x$), silicon nitride ($SiN_y$) or the like is formed by the plasma chemical vapor deposition (CVD), and patterning is then performed on the organic film, with the result that the channel protecting layer 5 having the predetermined shape can be formed.

Next, as shown in (f) of FIG. 2, the non-crystalline semiconductor layer 6 is formed on the channel layer 4 so as to cover the channel protecting layer 5. For example, as the non-crystalline semiconductor layer 6, an intrinsic amorphous silicon film can be formed by the plasma CVD. This intrinsic amorphous silicon film can be formed, for example, by introducing silane gas ($SiH_4$) and hydrogen gas ($H_2$) in a predetermined concentration proportion.

Subsequently, as shown in this figure, the contact layer 7 is formed on the non-crystalline semiconductor layer 6. For example, the contact layer 7 made of amorphous silicon doped with impurities of quinquevalent elements such as phosphorus is formed by the plasma CVD so as to cover the non-crystalline semiconductor layer 6.

Next, as shown in (g) of FIG. 2, the barrier layer 8 including a molybdenum nitride film is formed above the channel layer 4. In this embodiment, as shown in this figure, the barrier layer 8 is formed on the contact layer 7. The formation of the barrier layer 8 can be performed using a sputtering device. Specifically, a molybdenum target and the substrate 1 having the contact layer 7 as shown in (f) of FIG. 2 are placed in a sputtering device, and nitrogen gas and argon gas are introduced into the sputtering device so that the molybdenum target is sputtered over the substrate 1 in an unheated state. At this time, by adjusting the flow rate of argon gas and the flow rate of nitrogen gas, the film density of molybdenum nitride to be deposited can be adjusted in the range of 7.5 (g/cm$^3$) to 10.5 (g/cm$^3$). As above, the molybdenum nitride film in this embodiment is formed in an unheated state, that is, without performing, on the substrate 1, active heating which uses a heater or the like. Specifically, sputtering is performed in an atmosphere at room temperature (RT) to form the barrier layer 8 including a molybdenum nitride film.

It is to be noted that such sputtering can be performed using a parallel-plate-electrode DC magnetron sputtering device, and in this embodiment, the electrode size (the target size) is set to 302 mm in diameter, and the electrode interval (the target-substrate distance) is set to 60 mm. Furthermore, the pressure inside the device varies depending on the flow rate of nitrogen, and when the flow rate of nitrogen is 0 to 100 sccm, the total pressure will be 0.13 Pa to 0.42 Pa. In addition, a length of time for sputtering also depends on the flow rate of nitrogen; as the flow rate of nitrogen increases, the length of time for sputtering increases. For example, in the case of forming the barrier layer 8 having a film thickness of 20 nm, the length of time for sputtering will be about 8 to 30 seconds. The input power is set to 1.5 kW.

Next, as shown in (h) of FIG. 2, a source-drain metal film 9 which becomes the source electrode 9S and the drain electrode 9D is formed on the barrier layer 8 by using a metal including copper. For example, the source-drain metal film 9 made of copper is formed over an entire surface on the barrier layer 8 so as to cover the barrier layer 8.

Subsequently, although not shown, in order to pattern the source-drain metal film 9 and the barrier layer 8 into a predetermined shape, a resist is applied to the source-drain metal film 9, followed by exposure and development so that the resist is patterned into shapes which correspond to the shapes of the source electrode 9S and the drain electrode 9D.

Next, using this resist as a mask, an etching process such as wet etching is performed to pattern the source-drain metal film 9 and pattern the barrier layer 8 at the same time. By so doing, it is possible to form, as shown in (i) of FIG. 2, a pair of the source electrode 9S and the drain electrode 9D which are separate from each other with predetermined shapes and a pair of the barrier layers 8 which are separate from each other with predetermined shapes.

At this time, the contact layer 7 located under the barrier layer 8 functions as an etching stopper. In addition, the source line and the drain line can also be formed through this patterning. Specifically, it is possible to form the source line and the drain line each of which has a laminate structure including the metal film which forms the source electrode 9S (the drain electrode 9D) and the metal film which forms the barrier layer 8. Furthermore, as an etchant for etching the source-drain metal film 9 and the barrier layer 8, a hyperhydric etching solution can be used, for example.

Afterward, the resist on each of the source electrode 9S and the drain electrode 9D is removed and using each of the source electrode 9S and the drain electrode 9D as a mask, dry etching is performed, or alternatively, dry etching is performed with the resist remaining on each of the source electrode 9S and the drain electrode 9D, to pattern the contact layer 7 and the non-crystalline semiconductor layer 6 and to pattern the channel layer 4 into an island shape. By so doing, it is possible to form a pair of the contact layers 7 which are separate from each other with predetermined shapes, a pair of the non-crystalline semiconductor layers 6 which are separate from each other with predetermined shapes, and the island-shaped channel layer 4. As etching gas for the dry etching, chlorine-based gas can be used, for example.

In the manner as above, the thin-film transistor 10 according to this embodiment can be fabricated. In addition, this may be followed by deposition of SiN or the like by the plasma CVD so that the whole transistor is coated with a passivation film.

Next, the structure and properties of the barrier layers 8 in the thin-film transistor 10 according to this embodiment shall be described with reference to FIGS. 3A to 6B.

Figure 3A:
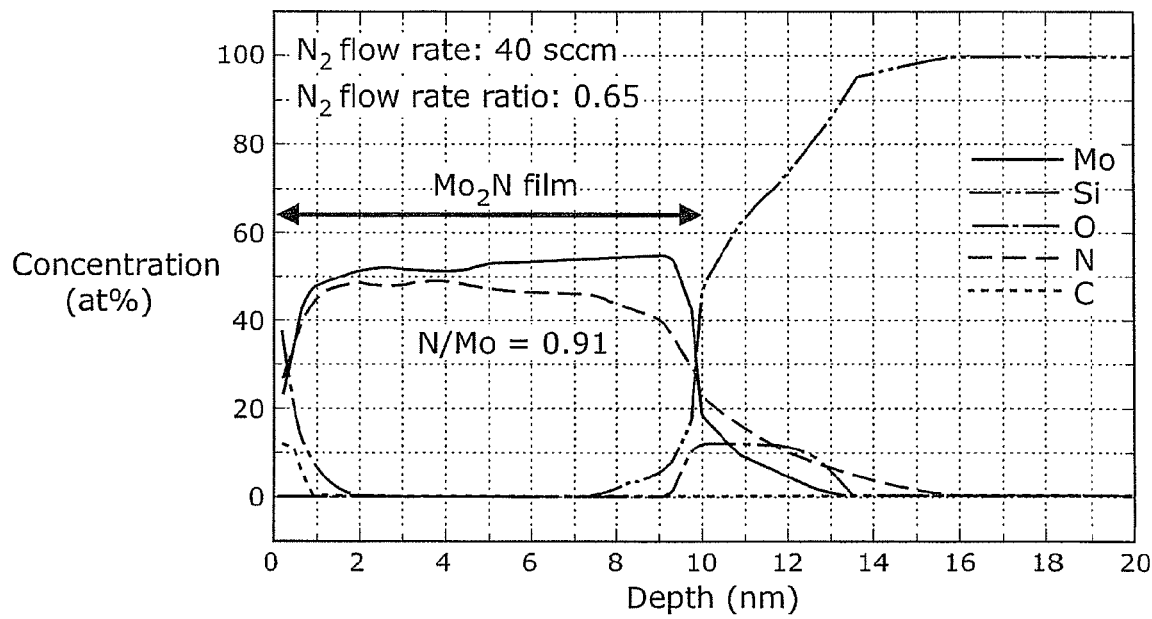
FIG. 3A shows atomic concentration distribution of a molybdenum nitride film (having a nitrogen flow rate of 40 sccm and an argon flow rate of 22 sccm) with respect to a thickness direction (a depth direction) in an embodiment of the present disclosure.
Figure 3B:
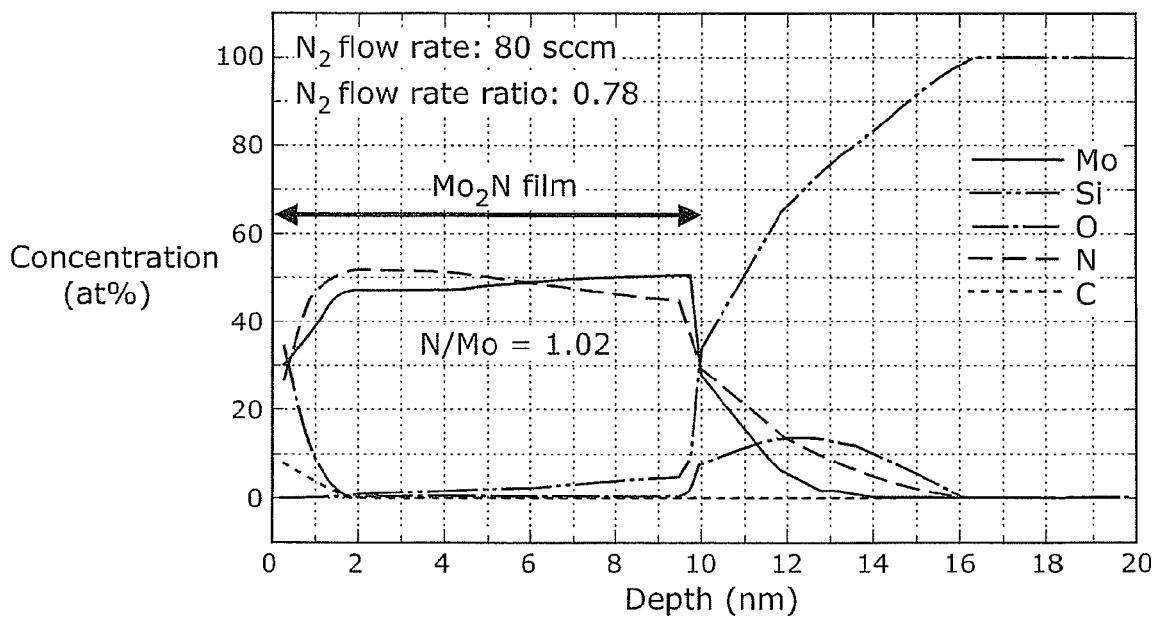
FIG. 3B shows atomic concentration distribution of a molybdenum nitride film (having a nitrogen flow rate of 80 sccm and an argon flow rate of 22 sccm) with respect to a thickness direction (a depth direction) in an embodiment of the present disclosure.

First, with reference to FIGS. 3A and 3B, a result of the high resolution-Rutherford backscattering spectrometry (HR-RBS) on the molybdenum nitride film shall be described. FIGS. 3A and 3B each show atomic concentration distribution of the molybdenum nitride film with respect to a thickness direction (a depth direction) in this embodiment.

In this experiment, as an analysis sample, a silicon substrate on which a 10 nm-thick molybdenum nitride film had been formed was prepared, and using HRBS500 produced by Kobe Steel., Ltd. as a measurement device, the depth-wise concentration of atoms in the sample was analyzed. The measurement conditions were as follows: incident ion energy 480 keV; ionic species He$^+$; scattering angle 62 degrees; incidence angle 45 degrees with respect to a surface normal of the sample; sample current 25 nA; and irradiance level 40 µC.

FIG. 3A shows a result of the analysis on the sample obtained in the case where the molybdenum nitride film is formed at a nitrogen flow rate of 40 sccm and an argon flow rate of 22 sccm (at a nitrogen flow rate ratio of 0.65). As shown in FIG. 3A, it was found that the composition ratio of nitrogen relative to molybdenum (N/Mo) in this molybdenum nitride film was 0.91.

FIG. 3B shows a result of the analysis on the sample obtained in the case where the molybdenum nitride film is formed at a nitrogen flow rate of 80 sccm and an argon flow rate of 22 sccm (at a nitrogen flow rate ratio of 0.78). As shown in FIG. 3B, it was found that the composition ratio of nitrogen relative to molybdenum (N/Mo) in this molybdenum nitride film was 1.02.

Thus, from the results shown in FIGS. 3A and 3B, it was found that molybdenum atoms and nitrogen atoms which are present in the molybdenum nitride film having a high proportion of nitrogen are almost the same in amount (in number).

Next, with reference to FIGS. 4A and 4B, a result of the XRD analysis on the molybdenum nitride film shall be described. FIGS. 4A and 4B each show an XRD spectrum of the sample including the molybdenum nitride film in this embodiment.

In this experiment, as an analysis sample, a glass substrate on which a 500 nm-thick silicon nitride (SiN) film, a 30 nm-thick amorphous silicon film, a 10 nm-thick molybdenum nitride film, and 300 nm-thick copper had been sequentially stacked was prepared, and using Horizontal Sample Mount X-ray Diffractometer produced by Rigaku Corporation as a measurement device, the sample was analyzed. The measurement conditions were as follows: target copper; target output 45 kV (200 mA); thin-film measurement ω fixed (2θ scanning); slit 0.5 mm of incident slit (IS); receiving slit (RS)1 20 mm; RS2 20 mm; parallel slit analyzer (PSA) 0.5°; incidence angle (ω) 0.5°; scanning speed 1°/min; sample width 0.02°; and measurement angle (2θ) 10° to 100°. Conversion into a single color was performed using a multilayer mirror and a horizontal monochromator.

FIG. 4A shows a result of the analysis on the sample obtained in the case where the molybdenum nitride film is formed at a nitrogen flow rate of 40 sccm and an argon flow rate of 22 sccm (at a nitrogen flow rate ratio of 0.65). FIG. 4B shows a result of the analysis on the sample obtained in the case where the molybdenum nitride film is formed at a nitrogen flow rate of 80 sccm and an argon flow rate of 22 sccm (at a nitrogen flow rate ratio of 0.78).

Thus, from the results shown in FIGS. 4A and 4B, it was found that the crystals in the molybdenum nitride film having a high proportion of nitrogen were not MoN containing Mo and N at an atom ratio of 1:1, but $Mo_2N$ containing Mo and N at an atom ratio of 2:1.

In view of the results of HR-RBS analysis in FIGS. 3A and 3B and the results of XRD analysis in FIGS. 4A and 4B, it was found that the crystals in the molybdenum nitride film were $Mo_2N$ when the composition ratio (N/Mo) of nitrogen to molybdenum contained at least in the molybdenum nitride film is greater than 0.9 (N/Mo>0.9).

As a result of further studies on the above results of HR-RBS and XRD analyses on the molybdenum nitride film, the inventors of the present application found that the molybdenum nitride film was expanded because of surplus nitrogen. This shall be described below with reference to FIGS. 5A and 5B. FIG. 5A schematically shows a structure of a typical molybdenum (Mo) film, and FIG. 5B schematically shows a structure of a molybdenum nitride film ($Mo_2N$) in this embodiment.

As shown in FIG. 5A, in the case of the structure in which a molybdenum film is formed between a copper film and a silicon film, the molybdenum film is considered to include crystal grain boundaries (among crystal grains) and flaws or voids within the crystal grains, which causes the copper atoms in the copper film to attempt to spread into the silicon film through, as diffusion paths, these crystal grain boundaries or the flaws or voids within the crystal grains.

At this time, when the molybdenum film is thick, the diffusing copper does not reach the silicon film and is blocked by the molybdenum film; the molybdenum film functions as a barrier layer. On the other hand, when the molybdenum film is thin, the diffusing copper passes through the molybdenum film and reaches the silicon film as shown in this figure; the molybdenum film in this case is not able to sufficiently function as a barrier layer.

The same applies to the conventional molybdenum nitride film; when the conventional molybdenum nitride film is thin, the diffusing copper passes through the conventional molybdenum nitride film and reaches the silicon film as does the above molybdenum film. As above, the conventional molybdenum nitride film which is thin is unable to sufficiently function as a barrier layer.

On the other hand, as shown in FIG. 5B, in the case of the structure in which a molybdenum nitride film made of $Mo_2N$ is formed between a copper film and a silicon film as in the thin-film transistor 10 according to this embodiment, the molybdenum nitride film is considered to include crystal grain boundaries and flaws or voids within the crystal grains as in the molybdenum film. However, in the molybdenum nitride film in this embodiment, unlike the molybdenum film shown in FIG. 5A, surplus nitrogen that is beyond the amount of nitrogen of crystals of molybdenum nitride ($Mo_2N$) is taken in the crystal grain boundaries or the flaws or voids within the crystal grains. In other words, nitrogen other than the nitrogen of $Mo_2N$ crystals (surplus nitrogen) is taken in the crystal grain boundaries or the flaws or voids within the crystal grains. Thus, the crystal grain boundaries or the flaws or voids within the crystal grains in the molybdenum nitride film are filled with the surplus nitrogen, that is, the surplus nitrogen is stored therein. In this embodiment, the molybdenum nitride film is considered to be expanded as a whole because of this surplus nitrogen. This means that it is considered that the molybdenum nitride film is more expanded with more surplus nitrogen.

Since the diffusion paths of copper are blocked by the surplus nitrogen in the molybdenum nitride film in this embodiment as above, the diffusion of copper can be reliably blocked by the molybdenum nitride film. Thus, the molybdenum nitride film in this embodiment has barrier properties which do not deteriorate even when the molybdenum nitride film is thin, and therefore is able to exhibit a high barrier effect.

Next, such film expansion of the molybdenum nitride film because of nitrogen shall be described with reference to FIGS. 6A and 6B. FIG. 6A shows a plurality of film formation conditions which are applied in forming a 10 nm-thick molybdenum nitride film (barrier layer), and film densities and barrier properties of the molybdenum nitride film formed under such conditions, in a thin-film transistor according to this embodiment. FIG. 6B shows a relationship between a nitrogen flow rate ratio which is applied in forming a 10 nm-thick molybdenum nitride film, and a film density of the formed molybdenum nitride film, in a thin-film transistor according to this embodiment. It is to be noted that the film formation conditions for the molybdenum nitride film in FIG. 6B are the same as the conditions of FIG. 6A and as the conditions described above with reference to (g) of FIG. 2, and copper was used for the source electrode and the drain electrode. In addition, the film density in FIG. 6B was measured using the X-ray reflectometer (XRR).

As shown in FIG. 6A, it was confirmed that all the 10 nm-thick molybdenum nitride ($Mo_2N$) films formed under the conditions shown in FIG. 6A had barrier properties. Specifically, it was confirmed that under all the conditions, copper of the source electrode 9S (the drain electrode 9D) had not been diffused into the channel layer 4, and the TFT characteristics of the thin-film transistor 10 did not vary. Thus, it was confirmed that when the barrier layer 8 is formed at a nitrogen/argon gas flow rate ratio of no less than 1.6, molybdenum nitride ($Mo_2N$) having barrier properties is formed.

Furthermore, in this embodiment, in forming the molybdenum nitride film, the substrate 1 is placed in an unheated state (that is, the temperature of the inside of the sputtering device is set to room temperature) so that the molybdenum nitride film is filled with the surplus nitrogen as shown in FIG. 5B. This is because, conversely, forming of a molybdenum nitride film above the heated substrate 1 will not provide the molybdenum nitride film with the structure as shown in FIG. 5B. Specifically, the forming of a molybdenum nitride film above the substrate 1 heated (for example, to 100 degrees Celsius) causes the surplus nitrogen in the molybdenum nitride film to come out of the film, with the result that crystal grain boundaries in the film or flaws or voids within crystal grains in the film are not filled with the surplus nitrogen; as shown in FIG. 5A, in the molybdenum nitride film, crystal grain boundaries or flaws or voids within crystal grains are present as the diffusion paths for copper In this case, when thinned, even the molybdenum nitride film cannot block the diffusion of copper, which causes a decrease in barrier properties. Thus, the forming of a molybdenum nitride film at room temperature allows nitrogen to be less likely to move away from the film and thereby allows the film to have, at a gas flow rate ratio under various conditions, a composition in which the proportion of nitrogen is higher than that in a conventional molybdenum nitride film.

In addition, although not shown in FIG. 6A, it was confirmed that even when only the gas flow rate of nitrogen is changed to 2.4 sccm and 5.5 sccm in forming the 10 nm-thick barrier layer 8, a molybdenum nitride film having barrier properties was able to be formed.

Furthermore, it was found that the film density of the molybdenum nitride ($Mo_2N$) film decreases as the gas flow rate ratio of nitrogen ($N_2$) increases as shown in FIG. 6B. In this embodiment, since the gas flow rate of argon is constant in forming the films, FIG. 6B also shows that the film density of the molybdenum nitride film decreases as the gas flow rate of nitrogen increases. Such a decrease in the film density with an increasing gas flow rate of nitrogen means that the molybdenum nitride film increases in volume with an increasing gas flow rate of nitrogen. Furthermore, from the result shown in FIG. 6B, it was found that the film density of the molybdenum nitride film was in the range of 7.5 ($g/cm^3$) to 10.5 ($g/cm^3$) when the gas flow rate ratio of nitrogen is greater than 0 and less than 1.0.

As above, in the thin-film transistor 10 according to this embodiment, the barrier layer 8 formed between the source electrode 9S or the drain electrode 9D and the channel layer 4 includes the molybdenum nitride film made of $Mo_2N$ with a film density of 7.5 ($g/cm^3$) to 10.5 ($g/cm^3$) and has a film structure in which the diffusion paths of impurities which attempt to pass through the barrier layer are filled with nitrogen. With this, even the barrier layer 8 thinned to about several to several tens of nm can block the diffusion of copper contained in the source electrode 9S or the drain electrode 9D, so that the copper can be prevented from entering the channel layer 4. Specifically, even in the case where the copper contained in the source electrode 9S (the drain electrode 9D) is thermally diffused due to heat taken in during a thermal process after the source electrode 9S (the drain electrode 9D) is formed, or even in the case where such copper is thermally diffused due to heat generated during an operation of TFT, the diffusing copper is blocked by the barrier layer 8, failing to reach the channel layer 4. Thus, the channel layer 4 is not polluted with copper, with the result that the TFT characteristics (such as off-state characteristics) of the thin-film transistor can be prevented from deteriorating. The thermal process includes a step of forming a passivation film of SiN or the like by the plasma CVD (at 300 degrees Celsius about for 30 minutes) or a step of forming, on the source electrode (the drain electrode), an inter-layer insulating film of SiO or the like by the plasma CVD in order to form a top metal. Furthermore, in this embodiment, the barrier layer 8 can be thinned, which makes it possible to provide low-cost wiring which has excellent workability of wet etching.

Next, an experiment to verify the barrier effect of the barrier layer 8 in the thin-film transistor 10 according to this embodiment was conducted, and a result of this experiment shall be described below with reference to FIGS. 7A, 7B, 8A, and 8B. In this experiment, SIMS was used to check the diffusion state of copper from the source electrode (the drain electrode) in a thin-film transistor according to a comparison example in which the barrier layer is a molybdenum film, and the diffusion state of copper from the source electrode (the drain electrode) in the thin-film transistor according to this embodiment in which the barrier layer is a molybdenum nitride film.

FIGS. 7A and 7B each show an SIMS measurement result of elements contained in a film included in the thin-film transistor according to the comparison example in which the barrier layer is a molybdenum film; FIG. 7A shows a result measured before thermal treatment, and FIG. 7B shows a result measured after the thermal treatment. FIGS. 8A and 8B each show an SIMS measurement result of elements contained in a film included in the thin-film transistor according to this embodiment in which the barrier layer is a molybdenum nitride film; FIG. 8A shows a result measured before thermal treatment, and FIG. 8B shows a result measured after the thermal treatment. In this embodiment, annealing was conducted at 350 degrees Celsius for 60 minutes as the thermal treatment.

The thin-film transistors used in the measurement of FIGS. 7A, 7B, 8A, and 8B are the same or like in structure as the thin-film transistor shown in FIG. 1, in which a 100 nm-thick copper film is formed as the source electrode 9S (the drain electrode 9D), a 10 nm-thick molybdenum or molybdenum nitride film is formed as the barrier layer 8, and a 30 nm-thick amorphous silicon film is formed as the non-crystalline semiconductor layer 6 (the contact layer 7 is not formed). This measurement is backside SIMS through which the concentration or secondary electron intensity of contained elements was measured in the direction of stacking of layers, under the following conditions: primary ion beam for analysis $O_2$; primary ion energy 3 keV; and secondary ion polarity positive.

As shown in FIGS. 7A and 7B, in the case of the thin-film transistor according to the comparison example in which a 10 nm-thick molybdenum (Mo) film was formed as the barrier layer, it can be seen that after the thermal treatment (FIG. 7B), the copper of the source electrode (the drain electrode) was diffused into silicon.

On the other hand, as shown in FIGS. 8A and 8B, in the case of the thin-film transistor according to this embodiment in which a 10 nm-thick molybdenum nitride ($Mo_2N$) film was formed as the barrier layer, it can be seen that even after the thermal treatment (FIG. 8B), the copper of the source electrode (the drain electrode) was not diffused into silicon, but was blocked by the molybdenum nitride film.

As above, in the thin-film transistor which includes the thinned barrier layer having a thickness of 10 nm, the barrier effect of the barrier layer formed of a conventional molybdenum film will be lowered while the barrier effect of the barrier layer formed of a molybdenum nitride film as in this embodiment will not be lowered.

With reference to FIG. 9, the following describes a relationship between annealing time and sheet resistance for a laminate film which includes a barrier layer and a source electrode (a drain electrode) formed of a copper film in a thin-film transistor. FIG. 9 shows the relationship between annealing time and sheet resistance for a laminate film which includes a barrier layer and a source electrode (a drain electrode) formed of a copper film in a thin-film transistor. FIG. 9 shows the measurements of the following five samples: (cross mark) no barrier layer; (triangle mark) the barrier layer including a 5 nm-thick molybdenum (Mo) film; (circle mark) the barrier layer including a 5 nm-thick molybdenum nitride ($Mo_2N$) film formed at a nitrogen flow rate of 40 sccm; (square mark) the barrier layer including a 5 nm-thick molybdenum nitride ($Mo_2N$) film formed at a nitrogen flow rate of 60 sccm; and (rhombus mark) the barrier layer including a 5 nm-thick molybdenum nitride ($Mo_2N$) film formed at a nitrogen flow rate of 80 sccm.

As shown in FIG. 9, annealing caused an increase in the sheet resistance of the samples with no barrier layer (cross mark) and with the barrier layer of a molybdenum film (triangle mark). In contrast, annealing caused no increase in the sheet resistance of the samples each with the barrier layer of a molybdenum nitride film. This showed that even a barrier layer which is so thin as 5 nm can provide barrier properties when a molybdenum nitride film is formed as the barrier layer.

With reference to FIG. 10, the following describes film-thickness dependency of the molybdenum nitride film on a sheet resistance increase ratio and a line width reduction ratio for the laminate film which includes the barrier layer and the source electrode (the drain electrode) formed of a copper film in the thin-film transistor. FIG. 10 shows the film-thickness dependency of the molybdenum nitride film on a sheet resistance increase ratio and a line width reduction ratio for the laminate film which includes the barrier layer and the source electrode (the drain electrode) formed of a copper film in the thin-film transistor. In FIG. 10, the sheet resistance increase ratio indicates the sheet resistance of the laminate film obtained as a result of 90 minute annealing relative to the sheet resistance of the laminate film obtained as a result of 30 minute annealing. The line width reduction ratio indicates a ratio of reduction in line width which is reduced by wet etching performed for patterning of a source line (a drain line) formed of a laminate film including a copper film and a molybdenum nitride film because etching of the molybdenum nitride film in the lower layer causes the copper film in the upper layer to be etched at the same time. Since the etching rate of copper is 15 times greater than the etching rate of the molybdenum nitride film, the molybdenum nitride film is as thin as possible, for example, in order to prevent unexpected etching of the copper line as much as possible.

Considering the sheet resistance increase ratio and the line width reduction ratio for the laminate film which includes: the source electrode (the drain electrode) formed of the copper film; and the barrier layer formed of the molybdenum nitride film, the thickness of the molybdenum nitride film is set to be no less than 2 nm and no more than 30 nm, for example.

Furthermore, the sheet resistance increase ratio of the laminate film is 1.15 or less, for example, which means that the thickness of the molybdenum nitride film is no less than 3 nm, for example, as shown in FIG. 10. In addition, the width reduction ratio of the copper film serving as a wiring line is 15% or less, for example, which means that the thickness of the molybdenum nitride film is 25 nm or less, for example, as shown in FIG. 10.

Thus, considering the sheet resistance increase ratio and the line width reduction ratio for the laminate film which includes the copper film and the molybdenum nitride film, the thickness of the molybdenum nitride film (the barrier layer) is no less than 2 nm and no more than 30 nm and more specifically is no less than 3 nm and no more than 25 nm, for example.

Next, a display apparatus according to an embodiment of the present disclosure shall be described with reference to FIG. 11. The display apparatus according to this embodiment of the present disclosure uses the thin-film transistor according to the above embodiment, and in this embodiment, an example in which the display apparatus is an organic EL display apparatus is described. FIG. 11 is a partial cutaway perspective view of the organic EL display apparatus according to the embodiment of the present disclosure.

The thin-film transistor according to the above embodiment can be used as a switching transistor or a driver transistor on an active matrix substrate in the organic EL display apparatus.

As shown in FIG. 11, an organic EL display apparatus 20 according to this embodiment includes: an active matrix substrate (TFT array substrate) 21; a plurality of pixels 22 arranged in rows and columns on the active matrix substrate 21; organic EL elements 23 formed in the respective pixels 22; a plurality of scan lines (gate lines) 27 formed along the rows of the pixels 22; a plurality of video signal lines (source lines) 28 formed along the columns of the pixels 22; and power source lines 29 (not shown) formed in parallel with the video signal lines 28. Each of the organic EL elements 23 includes an anode 24, an organic EL layer 25, and a cathode 26 which are sequentially stacked on the active matrix substrate 21. In practice, a plurality of anodes 24 is formed so as to correspond to the respective pixels 22. A plurality of organic EL layers 25 is also formed so as to correspond to the respective pixels 22, and each of the organic EL layers 25 includes stacked layers which are an electron transport layer, a light-emitting layer, a hole transport layer, and the like.

Next, the circuitry of the pixel 22 in the above organic EL display apparatus 20 shall be described with reference to FIG. 12. FIG. 12 shows the circuitry of a pixel which uses a thin-film transistor according to an embodiment of the present disclosure.

As shown in FIG. 12, each pixel 22 is sectioned by the crossing scan lines 27 and video signal lines 28 and includes a driver transistor 31, a switching transistor 32, a capacitor 33, and the organic EL element 23. The driver transistor 31 is a transistor for driving the organic EL element 23, and the switching transistor 32 is a transistor for selecting the pixel 22.

In the driver transistor 31, a gate electrode 31G is connected to a drain electrode 32D of the switching transistor 32, a source electrode 31S is connected to the anode of the organic EL element 23 via a relay electrode (not shown), and a drain electrode 31D is connected to each of the power source lines 29.

Furthermore, in the switching transistor 32, the gate electrode 32G is connected to the scan line 27, the source electrode 32S is connected to the video signal line 28, and the drain electrode 32D is connected to the capacitor 33 and the gate electrode 31G of the driver transistor 31.

In this circuitry, a gate signal is input to the scan line 27, and when the switching transistor 32 is placed in ON state, then a video signal voltage supplied through the video signal line 28 is written into the capacitor 33. The video signal voltage written in the capacitor 33 is held for one frame period, and this held video signal voltage causes an analog change in the conductance of the driver transistor 31, with the result that the drive current which corresponds to the light tone flows from the anode to the cathode of the organic EL element 23 to cause the organic EL element 23 to emit light.

Although the organic EL display apparatus which uses the organic EL elements has been described in this embodiment, the present disclosure is applicable to other display apparatuses which use an active matrix substrate. In addition, the display apparatus configured as above can be used as a flat-panel display and is therefore applicable to electronic devices with various display panels, such as a television set, a personal computer, and a mobile phone.

Although the foregoing has described the thin-film transistor and the thin-film transistor manufacturing method according to the embodiments of the present disclosure, the thin-film transistor and the thin-film transistor manufacturing method according to the present disclosure are not limited to the above-described embodiments.

For example, in forming the barrier layer, argon is introduced as an inert gas together with nitrogen gas in the above embodiments, but the gas which is introduced together with nitrogen gas is not limited to argon and may be other rare gas such as xenon or krypton.

Furthermore, although the contact layer 7 is formed between the non-crystalline semiconductor layer 6 and the barrier layer 8 in the above embodiments, it is not always necessary to provide the contact layer 7. The contact layer 7 is the $n^+$ layer in the above embodiments, but may be a contact layer having a laminate structure which includes an $n^-$ layer or the like in addition to the $n^+$ layer.

Furthermore, although the non-crystalline semiconductor layer 6 is formed between the channel layer 4 and the contact layer 7 in the above embodiments, it is not always necessary to provide the non-crystalline semiconductor layer 6. The pair of non-crystalline semiconductor layers 6 are formed so as to be spaced from each other across the channel protecting layer 5, but may be continuously formed between the channel protecting layer 5 and the channel layer 4.

Furthermore, the above embodiments provide the channel-protected thin-film transistor which includes the channel protecting layer 5, it may also be possible to provide a channel-etched thin-film transistor without forming the channel protecting layer 5.

Furthermore, although the above embodiments use the silicon film for the channel layer 4, it may be possible to use a semiconductor film other than the silicon film. For example, it is possible to form the channel layer 4 by crystallizing a semiconductor film made of germanium (Ge) or SiGe. Furthermore, the channel layer 4 may be either an n-type semiconductor or a p-type semiconductor. Moreover, the channel layer 4 may be an oxide semiconductor.

Furthermore, the above embodiments use copper as the material of the source-drain metal film 9 that is a precursor film for the source electrode 9S, the drain electrode 9D, the source line, and the drain line, but it may be possible to use aluminum (Al). In other words, the barrier layer 8 in the above embodiments has a structure filled with nitrogen and is therefore able to block the diffusion of aluminum, which provides barrier properties also to an aluminum electrode (an aluminum wiring line).

Although only some exemplary embodiments of the present general inventive concept have been described in detail above, those skilled in the art will readily appreciate that many modifications are possible in the exemplary embodiments and other embodiments are possible by arbitrarily combining some of the structural elements and functions of different exemplary embodiments without materially departing from the novel teachings and advantages of the present general inventive concept. Accordingly, all such modifications are intended to be included within the scope of the present general inventive concept.

Industrial Applicability

The thin-film transistors in one or more exemplary embodiments of the present general inventive concept can be widely used in display apparatuses such as a television set, a personal computer, and a mobile phone, or other various electric devices which have thin-film transistors.

The invention claimed is:

1. A thin-film transistor comprising:
a substrate;
a gate electrode above the substrate;
a gate insulating layer on the gate electrode;
a semiconductor layer on the gate insulating layer which is located on the gate electrode;
a source electrode above the semiconductor layer;
a drain electrode above the semiconductor layer; and
a barrier layer between the semiconductor layer and the source electrode and between the semiconductor layer and the drain electrode,
wherein each of the source electrode and the drain electrode comprises a metal including copper, and
the barrier layer contains nitrogen and molybdenum and has a density greater than 7.5 g/cm$^3$ and less than 10.5 g/cm$^3$.

2. The thin-film transistor according to claim 1,
wherein a composition ratio of nitrogen to molybdenum contained in the barrier layer is greater than 0.9.

3. The thin-film transistor according to claim 2,
wherein the barrier layer has a structure including: a plurality of crystal grains comprising Mo$_2$N; and nitrogen contained in between the crystal grains.

4. The thin-film transistor according to claim 1,
wherein the barrier layer has a thickness of no less than 2 nm and no less than 30 nm.

5. The thin-film transistor according to claim 4,
wherein the barrier layer has a thickness of no less than 3 nm and no more than 25 nm.

6. The thin-film transistor according to claim 1,
wherein a contact layer is provided between the semiconductor layer and the barrier layer.

7. A thin-film transistor manufacturing method comprising:
preparing a substrate having a semiconductor layer;
forming, above the semiconductor layer, a barrier layer including a molybdenum nitride film; and
forming, on the barrier layer, a source electrode and a drain electrode from a metal including copper,
wherein in the forming of a barrier layer, the substrate and a molybdenum target are placed in a sputtering device and the molybdenum target is sputtered in an unheated state by introducing nitrogen gas and an inert gas, to thereby form the molybdenum nitride film which has a density greater than 7.5 g/cm$^3$ and less than 10.5 g/cm$^3$.

8. The thin-film transistor manufacturing method according to claim 7,
wherein the inert gas is argon gas, and
in the forming of a barrier layer, a gas flow rate ratio of the nitrogen gas to the argon gas is set to no less than 1.6 to form the barrier layer.

9. The thin-film transistor manufacturing method according to claim 7,
wherein the sputtering in the unheated state in the forming of a barrier layer is performed at room temperature.

* * * * *